(12) United States Patent
Nogami et al.

(10) Patent No.: US 7,609,980 B2
(45) Date of Patent: Oct. 27, 2009

(54) OPTICAL RECEIVER AND DISCRIMINATION-THRESHOLD GENERATING METHOD

(75) Inventors: Masamichi Nogami, Tokyo (JP); Junichi Nakagawa, Tokyo (JP); Masaki Noda, Tokyo (JP); Toyoaki Uo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 431 days.

(21) Appl. No.: 10/585,458

(22) PCT Filed: Sep. 28, 2005

(86) PCT No.: PCT/JP2005/017812

§ 371 (c)(1),
(2), (4) Date: Jul. 7, 2006

(87) PCT Pub. No.: WO2007/036993

PCT Pub. Date: Apr. 5, 2007

(65) Prior Publication Data

US 2007/0098416 A1      May 3, 2007

(51) Int. Cl.
*H04B 10/06*        (2006.01)
(52) U.S. Cl. .................. 398/208; 398/207; 398/212
(58) Field of Classification Search .................. 398/207, 398/208, 212–214
See application file for complete search history.

(56) References Cited

U.S. PATENT DOCUMENTS

| 5,844,445 A * | 12/1998 | Takeyari ............... 330/293 |
| 6,169,619 B1 * | 1/2001 | Ide ....................... 398/209 |
| 2001/0019441 A1 * | 9/2001 | Kogure et al. ......... 359/158 |
| 2002/0153958 A1 * | 10/2002 | Ide ....................... 330/308 |

FOREIGN PATENT DOCUMENTS

| JP | 1-188143 | 7/1989 |
| JP | 1-286655 | 11/1989 |
| JP | 2723874 | 11/1997 |
| JP | 2814990 | 8/1998 |

* cited by examiner

*Primary Examiner*—Dzung D Tran
(74) *Attorney, Agent, or Firm*—Oblon, Spivak, McClelland, Maier & Neustadt, L.L.P.

(57) ABSTRACT

A first average detecting circuit detects an average of output signals of a pre-amplifying unit that controls an amplification gain based on a result of comparison between an output of the first average detecting circuit and a predetermined reference voltage. A discriminating circuit receives an output signal of the pre-amplifying unit as an input signal and performs a signal discrimination of the input signal based on a threshold. A second average detecting circuit detects an average of input signals to the discriminating circuit. The discriminating circuit receives an output of the second average detecting circuit as the threshold.

5 Claims, 7 Drawing Sheets

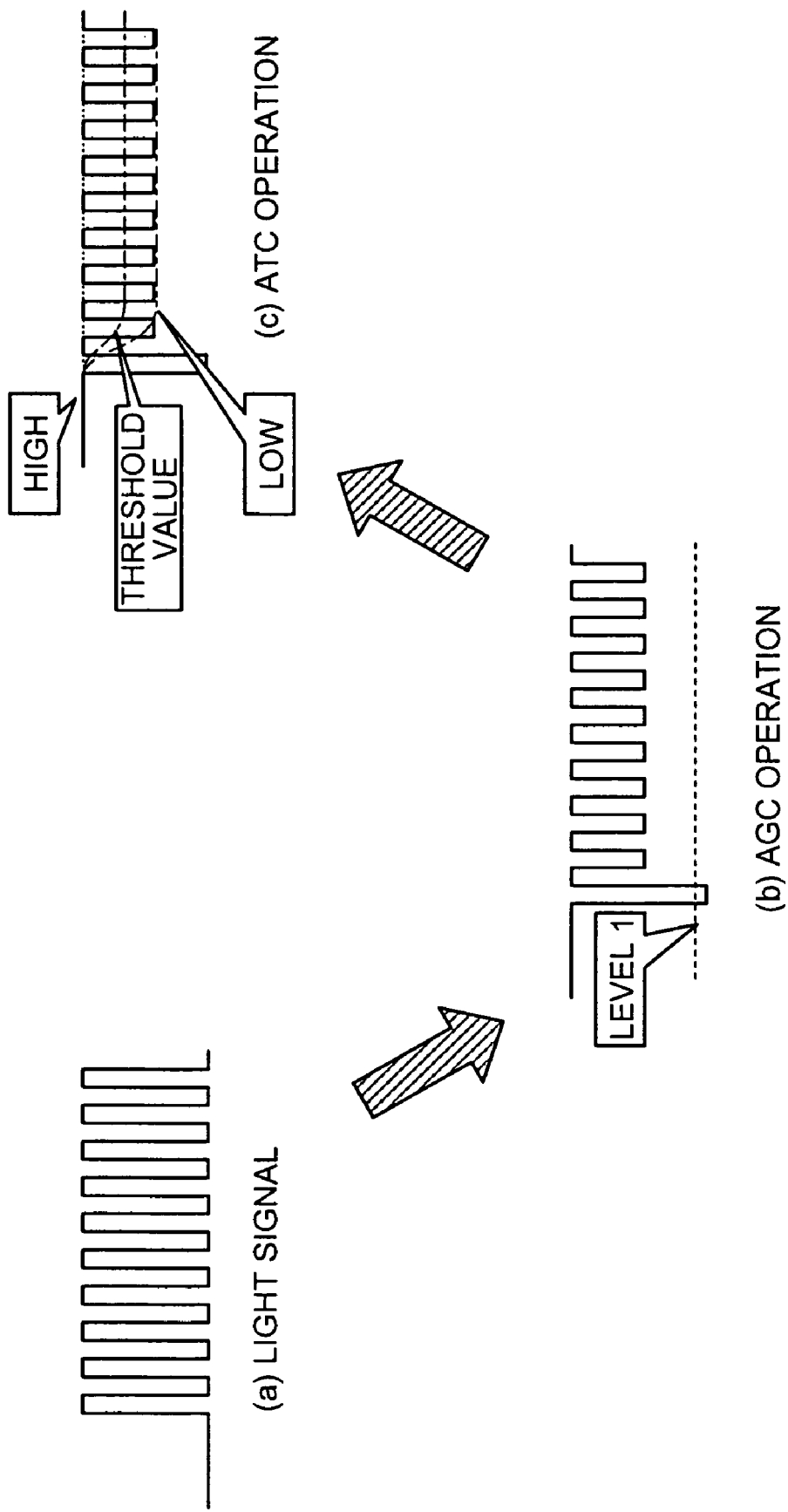

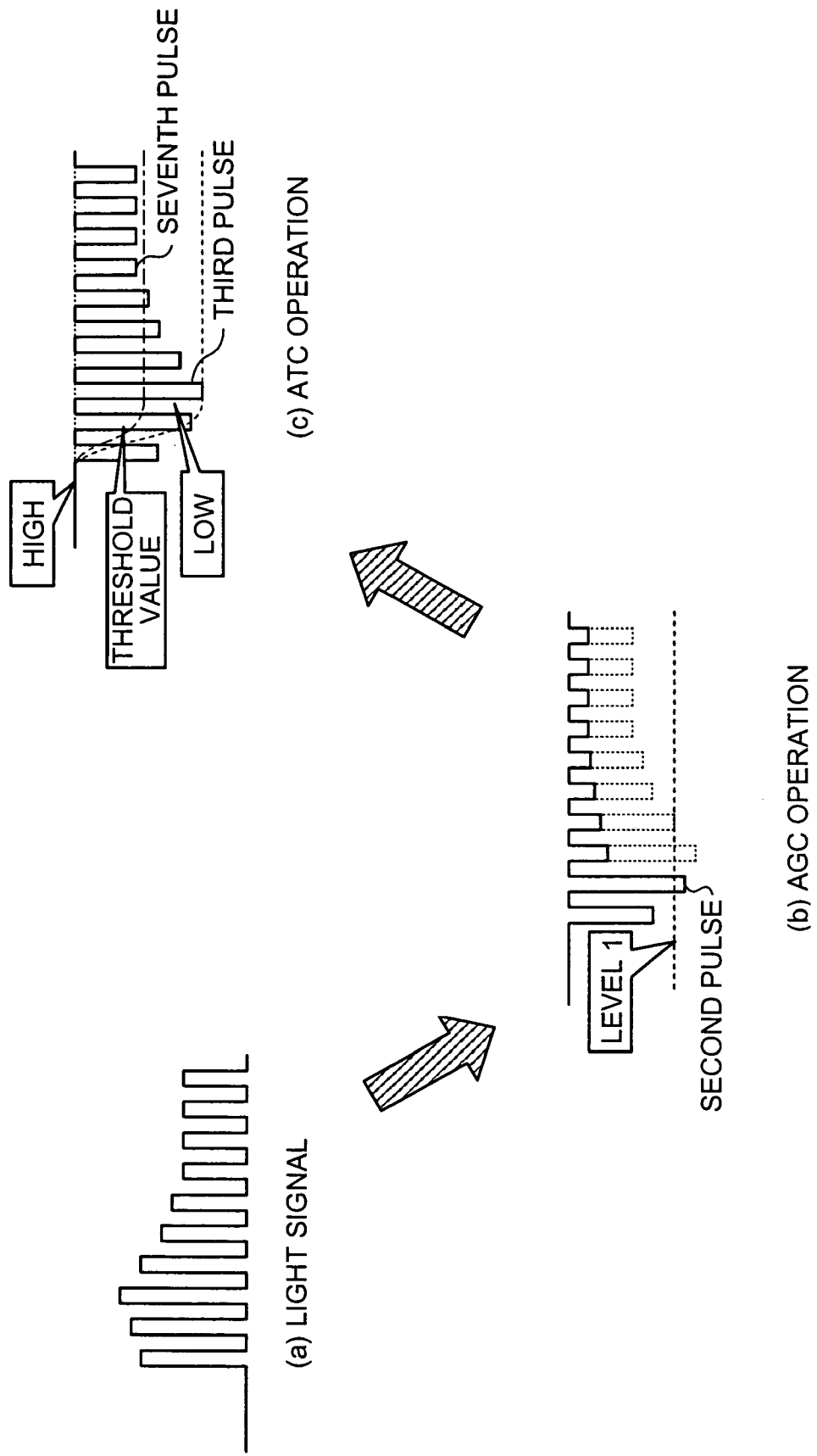

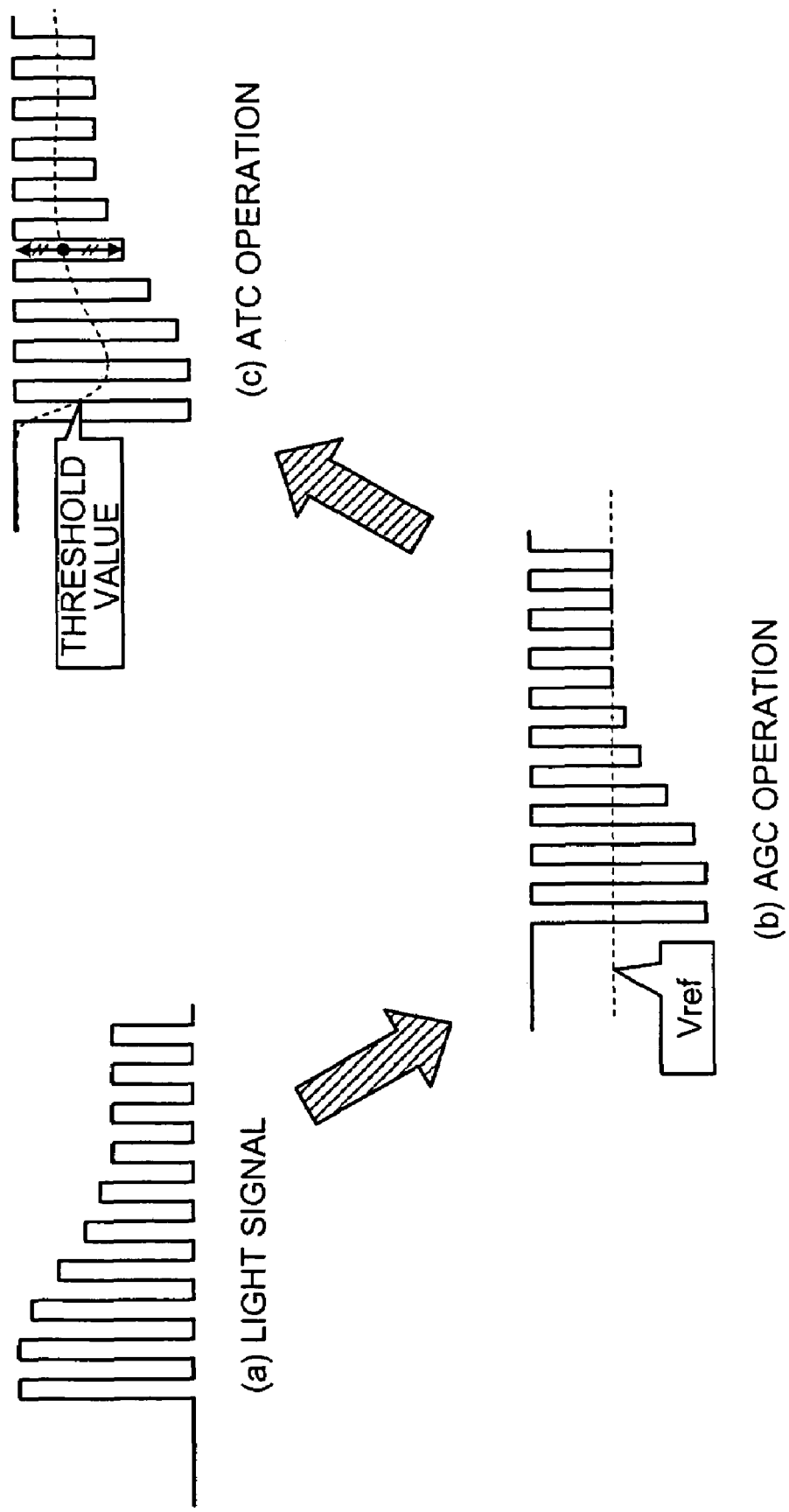

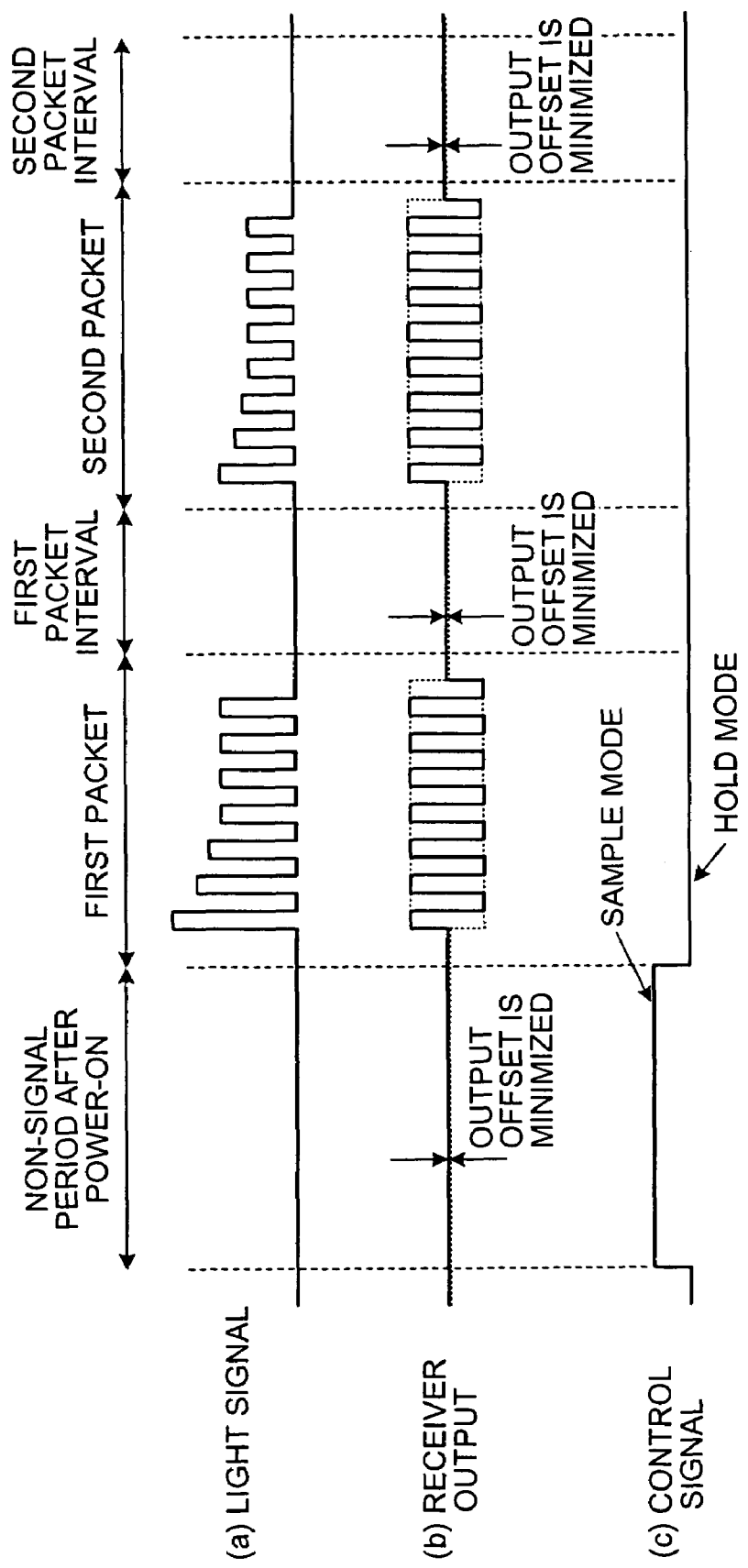

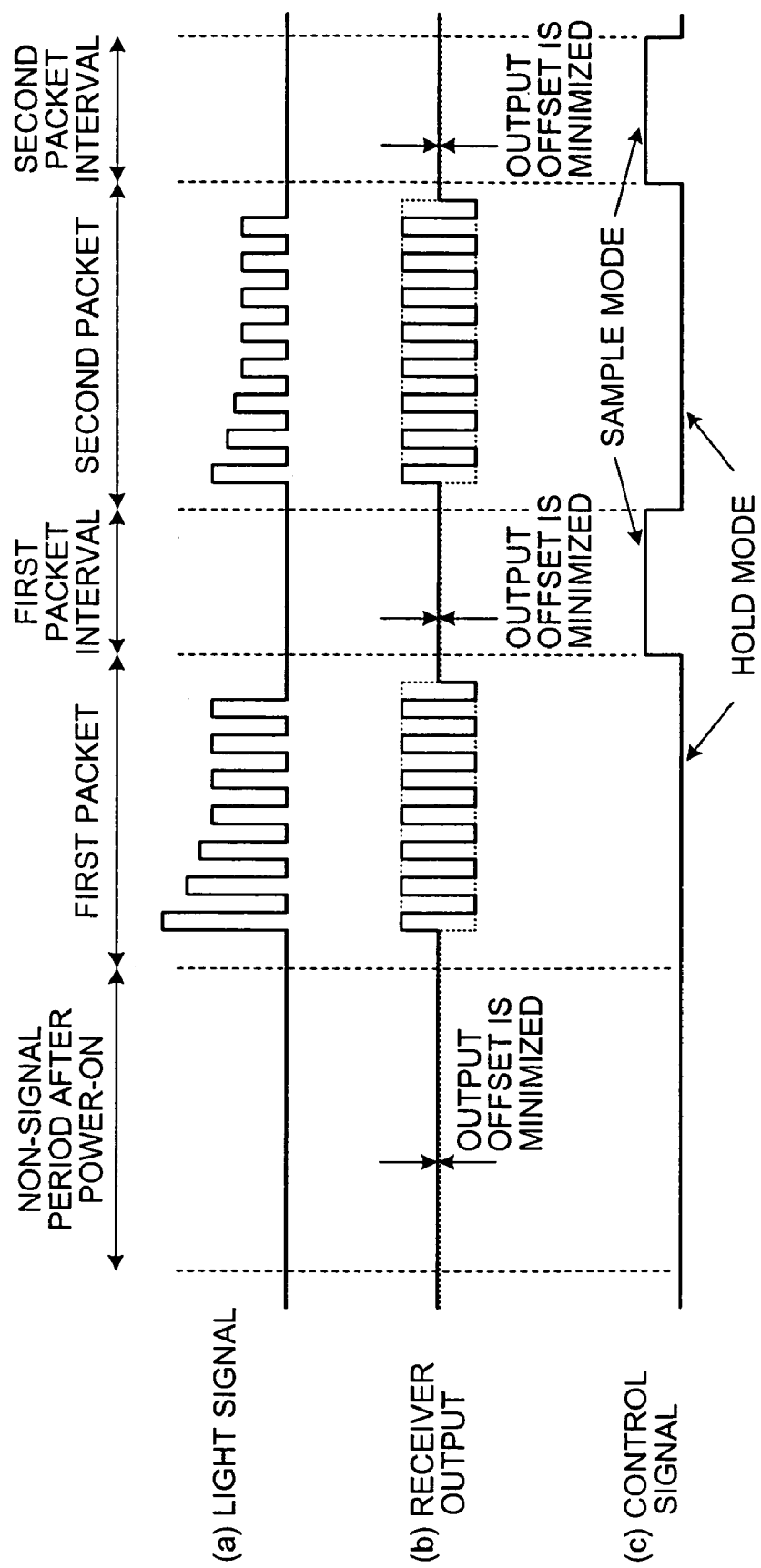

OPTICAL RECEIVER AND DISCRIMINATION-THRESHOLD GENERATING METHOD

TECHNICAL FIELD

The present invention relates to an optical receiver, and more particularly, to an optical receiver suitable for a passive-optical-network (PON) system that transmits a burst-like light signal and a discrimination-threshold generating method for the optical receiver.

BACKGROUND ART

As an optical receiver applied to a conventional PON system, for example, there is a burst digital optical receiver disclosed in a Patent Document 1 described below. The optical receiver includes a photoelectric conversion element, an automatic-threshold-control (ATC) circuit, and a discriminator. The photoelectric conversion element converts a received burst digital light signal into an electric signal; a preamplifier that outputs a first positive phase signal and a first negative phase signal with a differential output obtained by amplifying this electric signal to a predetermined level. The ATC circuit outputs a second positive phase signal and a second negative phase signal in a reverse-phase relation with the second positive phase signal, the second positive phase signal being obtained by averaging a value of the first positive phase signal and a value obtained by peak-holding the first negative phase signal and the second negative phase signal being obtained by averaging a value of the first negative phase signal and a value obtained by peak-holding the first positive phase signal at signal time or a value of an offset voltage set higher than this value at no-signal time. The discriminator decides, from the second positive phase signal and the second negative phase signal, a logical value "0" at the no-signal time of the burst digital light signal, and performs logical decision according to an intermediate value of amplitude values of the burst digital light signal and outputs logical values "1" and "0" at the signal time.

In the above optical receiver, the preamplifier connected to the photoelectric conversion element controls a gain of the preamplifier itself according to a detection level obtained by subjecting an optical output signal level from the photoelectric conversion element to peak detection at high speed. The auto threshold control circuit connected to an output side of the preamplifier inputs a discrimination output (level) to the discriminator at the post-stage. The discrimination output is obtained by averaging a signal output of a differential output signal outputted from the preamplifier and a selection circuit output generated based on two detection outputs obtained by performing peak detection (PD) and bottom detection (BD).

Patent Document 1: Japanese Patent Application Laid-Open No. H9-181687.

DISCLOSURE OF INVENTION

Problem to be Solved by the Invention

However, since a transient response inevitably occurs in actual burst light emission, regardless of the fact that gain switching is unnecessary, it is highly likely that the gain switching is performed according to a detection output level responding to a transient response amplitude that fluctuates due to the transient response. Since the auto threshold control circuit generates a threshold following the transient response amplitude, it is highly likely that a wrong discrimination level is generated.

The present invention has been devised in view of the above description and it is an object of the present invention to provide an optical receiver and a discrimination-threshold generating method for the optical receiver, which are capable of preventing unintended switching of a gain and generation of a wrong discrimination level even if there is a transient response in a light signal and generating a discrimination level equivalent to a discrimination level at the time when there is no transient response.

Means for Solving Problem

To solve the above problems and achieve the object, an optical receiver according to an aspect of the present invention includes a pre-amplifying unit that performs voltage conversion and amplification of an output of a light-receiving element to that receives a light signal and converts the light signal into a current signal; and a regenerating unit including a discriminating circuit that receives an output signal of the pre-amplifying unit as an input signal and performs a signal discrimination of the input signal based on a threshold generated based on the input signal. The pre-amplifying unit includes a first average detecting circuit that detects an average of output signals of the pre-amplifying unit, and controls an amplification gain of the pre-amplifying unit based on an output of comparison between an output of the first average detecting circuit and a predetermined reference voltage. The regenerating unit includes a second average detecting circuit that detects an average of input signals to the discriminating circuit, and outputs an output of the second average detecting circuit to the discriminating circuit as a threshold for signal discrimination of the input signal.

Effect of the Invention

According to the present invention, the pre-amplifying unit controls an amplification gain of the pre-amplifying unit itself based on a comparative output of an output of the first average detecting circuit, which detects an average of output signals of the pre-amplifying unit itself, and the predetermined reference voltage. The regenerating unit outputs an output of the second average detecting circuit, which detects an average of input signals to the discriminating circuit, to the discriminating circuit as a threshold for performing signal discrimination of the input signals. Thus, there is an effect that unintended gain switching in the pre-amplifying unit is prevented and it is possible to generate a threshold that does not cause an error in regeneration processing.

BRIEF DESCRIPTION OF DRAWINGS

FIG. 2A is a diagram for explaining an operation in an optical receiver, to which a conventional technology is applied, at the time when a transient response is not taken into account;

FIG. 2B is a diagram for explaining an operation in the optical receiver, to which the conventional technology is applied, at the time when a transient response is taken into account;

FIG. 3 is a diagram for explaining an operation in the optical receiver in the first embodiment at the time when a transient response is taken into account;

FIG. 5 is a diagram for explaining an operation of an optical receiver according to a third embodiment of the present invention; and FIG. 6 is a diagram for explaining an operation of an optical receiver according to a fourth embodiment of the present invention.

EXPLANATIONS OF LETTERS OR NUMERALS

Figure 1:
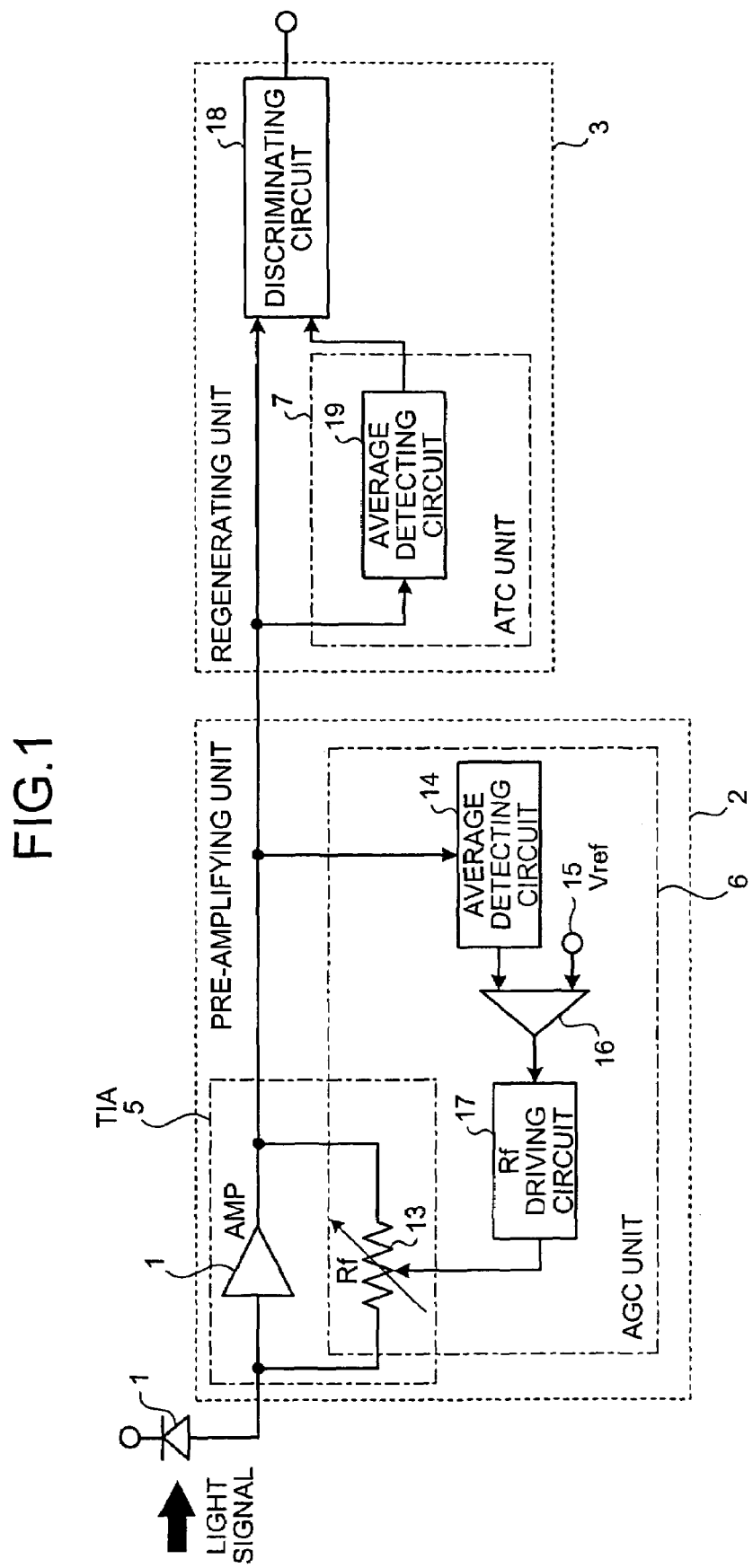
FIG. 1 is a block diagram of a constitution of an optical receiver according to a first embodiment of the present invention.

1 Light-receiving element
2 Pre-amplifying unit
3 Regenerating unit
6 AGC unit
7 ATC unit
12 Inverting amplifier (AMP)
13 Feedback resistor (Rf)
14, 19 Average detecting units
15 Reference voltage
16, 22 Comparing circuits
17 Feedback resistor (Rf) driving unit
18, 21 Discriminating circuits
23 S/H circuit
24 Control signal
25 Offset adjusting circuit
26 Buffer unit

BEST MODE(S) FOR CARRYING OUT THE INVENTION

Exemplary embodiments of an optical receiver and a discrimination-threshold generating method for the optical receiver according to the present invention are explained in detail below with reference to the accompanying drawings. The present invention is not limited by the embodiments.

FIRST EMBODIMENT

FIG. 1 is a block diagram of a constitution of an optical receiver according to a first embodiment of the present invention. The optical receiver shown in the figure includes a light-receiving element 1 that receives a light signal, a pre-amplifying unit 2 that is inputted with an output current of the light-receiving element 1 and converts an inputted current signal into a voltage signal and outputs the voltage signal, and a regenerating unit 3 that is inputted with an output voltage of the pre-amplifying unit 2 and discriminates a voltage level of the output voltage inputted. As a constructional detail of the optical receiver, the pre-amplifying unit 2 includes a transimpedance amplifier (TIA) 5 and an automatic-gain-control (AGC) unit 6. On the other hand, the regenerating unit 3 includes an automatic-threshold-control (ATC) unit 7 that generates and outputs a predetermined threshold level and a discriminating circuit 18 that performs discrimination of an input signal (level) based on an input signal to the discriminating circuit 18 itself and an output of the ATC unit 7.

Moreover, as the constructional detail of the optical receiver, the TIA 5 includes an inverting amplifier 12 and a feedback resistor (Rf) 13 and the AGC unit 6 includes an average detecting unit 14 that detects an average of output levels of the pre-amplifying unit 2, a comparing circuit 16 that compares an output level of the average detecting unit 14 and a reference voltage (Vref) 15, a feedback-resistor (Rf) driving unit 17 that variably controls a resistance of the feedback resistor (Rf), and the feedback resistor (Rf) 13. Since the feedback resistor 13 has both a conversion action of converting a current signal into a voltage signal and a gain control action for the inverting amplifier 12, the feedback resistor 13 is included in the respective components, the TIA 5 and the AGC unit 6, as described above.

Operations of the optical receiver shown in FIG. 1 are explained below. In the figure, a light signal received by the light-receiving element 1 is converted into a current signal. Then, the light signal is converted into a voltage signal and amplified by the TIA 5. Thereafter, an average of output amplitudes is continuously detected by the average detecting unit 14 serving as a first average detecting circuit. A differential voltage between the average and the reference voltage 15 is generated by the comparing circuit 16. The feedback-resistor driving unit 17 drives (variably controls) a value of the feedback resistor 13 based on an output signal of the comparing circuit 16. According to such control, for example, when an output amplitude of the TIA 5 is larger than the reference voltage 15, an AGC control is performed to reduce the output amplitude to an amplitude determined by the reference voltage 15.

In the regenerating unit 3, a predetermined threshold voltage is generated and outputted by an average detecting unit 19, which serves as a second average detecting circuit, as an output from the ATC unit 7 to the discriminating circuit 18. As a result, the regeneration processing is performed based on a discrimination level according to light-receiving power of the light-receiving element 1.

As described in the section of the problems to be solved by the invention, in an actual light burst signal, there is an amplitude fluctuation component caused by a transient response. Therefore, a transient response operation in the optical receiver to which the conventional technology is applied is explained below.

First, an operation in the optical receiver at the time when a transient response is not taken into account (it is assumed that there is no transient response) is explained with reference to FIG. 2A. FIG. 2A is a diagram for explaining an operation (an ideal operation at the time when a transient response is not taken into account) in the optical receiver to which the conventional technology is applied. In explanations of respective operations in FIG. 2A and FIG. 2B described later, an optical receiver having a general constitution, to which the conventional technology is applied, is assumed.

In FIG. 2A, (a) is a diagram of an ideal light signal waveform at the time when a transient response is not taken into account (it is assumed that there is no transient response). When this light signal is converted into a current signal by a light-receiving element and inputted to a pre-amplifying unit, since a leading pulse of a burst signal exceeds a level (a level 1) at the time when the AGC operates, an AGC gain is instantly reduced to limit an output amplitude ((b) in the figure). On the other hand, when an output signal of the pre-amplifying unit with the output amplitude limited is inputted to the regenerating unit 3, the ATC operates and a threshold level for discrimination is set to an intermediate level between an upper limit level (a "High" level) and a lower limit level (a "Low" level) of a signal pulse ((c) in the figure). In this way, in the optical receiver having the general constitution to which the conventional technology is applied, in a usual operation at the time when a transient response is not taken into account, the AGC unit operates when gain switching is necessary and the ATC unit also operates to generate a discrimination level corresponding to an amplitude of an input signal to the ATC unit itself. Therefore, it can be said that, in the optical receiver having the general constitution to which the conventional technology is applied, it is difficult to find presence of a problem insofar as the operation at the time when there is no transient response is considered.

An operation in the optical receiver at the time when a transient response is taken into account (it is assumed that there is a transient response) is explained below with reference to FIG. 2B. FIG. 2B is a diagram for explaining an operation in the optical receiver, to which the conventional technology is applied, at the time when a transient response is taken into account.

In FIG. 2B, (a) is a diagram of a light signal waveform at the time when a transient response is taken into account. When this light signal is converted into a current signal by the light-receiving element and inputted to the pre-amplifying unit, in an example shown in (b) in the figure, since a second pulse of a burst signal exceeds the level (the level 1) at the time when the AGC unit operates, an AGC gain is reduced to limit an output amplitude. In (b) in the figure, a waveform indicated by a solid line is a waveform at the time when AGC operates. On the other hand, a waveform indicated by a wavy line is a waveform at the time when it is assumed that the AGC unit does not operate. As shown in (b) in the figure, when there is a transient response, an AGC operation acts even when it is unnecessary to actuate the AGC. As a result, unintended fall in an output amplitude occurs. A part indicated by (c) is a waveform showing an output signal of the pre-amplifying unit at the time when the AGC does not operate. When this signal is inputted to the regenerating unit, in the regenerating unit, the ATC unit operates and a threshold level for discrimination is set to, for example, an intermediate level between an upper limit level (a "High" level) and a lower limit level (a "Low" level) of a third pulse of the burst signal. When such a threshold level is set, a seventh pulse and the subsequent pulses of the burst signal inputted to the regenerating unit are discriminated by mistake. When the AGC operation is taken into account (it is assumed that the AGC unit operates), since a signal level inputted to the regenerating unit further falls, an error rate of discrimination is further deteriorated.

In this way, it is seen that, in the optical receiver having the general constitution to which the conventional technology is applied, there is a problem in that an unintended gain switching in the AGC unit is performed and an unintended threshold level (discrimination level) in the ATC unit is generated depending on a degree of a transient response of an inputted light signal waveform and an error is made in setting of a discrimination level.

An operation at the time when a transient response in the optical receiver in the first embodiment is taken into account (it is assumed that there is a transient response) is explained below with reference to FIG. 3. FIG. 3 is a diagram for explaining an operation in the optical receiver in the first embodiment at the time when a transient response is taken into account.

In FIG. 3, (a) is a diagram of a light signal waveform at the time when a transient response similar to (a) shown in FIG. 2B is taken into account. When this light signal is converted into a current signal by the light-receiving element 1 in FIG. 1 and inputted to the pre-amplifying unit 2, for example, as (b) shown in FIG. 3, even if output levels of first to sixth pulses of a burst signal exceed the reference voltage 15 that is one input signal inputted to the comparing circuit 16, an average output from the average detecting unit 14, which is the other input signal inputted to the comparing circuit 16, does not exceed the reference voltage 15 or an amount of decrease in an AGC gain is small even if the average output exceeds the reference voltage 15. Thus, in such a transient response period, AGC rarely acts and a signal waveform of a light-receiving output signal is maintained. As a result, unintended gain switching in the AGC unit is prevented.

A signal waveform of (b) shown in FIG. 3 is inputted to the regenerating unit 3 as an output waveform of the pre-amplifying unit 2. In the regenerating unit 3, the average detecting unit 19 of the ATC unit 7 operates and a threshold level for discrimination is set to an intermediate level between upper limit levels ("High" levels) and lower limit levels ("Low" levels) of respective pulses of the burst signal. Therefore, since the threshold level follows substantially a median (an average) of the upper limit levels and the lower limit levels of the respective pulses, a threshold level that does not cause an error in regeneration processing is generated.

As explained above, in the optical receiver according to this embodiment, the pre-amplifying unit controls an amplification gain of the pre-amplifying unit itself based on a comparative output of an output of the first average detecting circuit, which detects an average of output signals of the pre-amplifying unit itself, and a predetermined reference voltage. The regenerating unit outputs an output of the second average detecting circuit, which detects an average of input signals to the discriminating circuit, to the discriminating circuit as a threshold for performing signal discrimination of the input signals. Thus, unintended gain switching in the pre-amplifying unit is prevented and it is possible to generate a threshold level that does not cause an error in regeneration processing.

In the constitution described in this embodiment, a gain of the TIA, that is, a gain of the pre-amplifying unit is controlled based on feedback resistance control of the feedback resistor driving unit. However, the present invention is not limited to this constitution. Any constitution is included in the present invention as long as, for example, it is possible to control a gain of the pre-amplifying unit based on a result of comparison between an output of the average detecting unit and the predetermined reference voltage.

SECOND EMBODIMENT

Figure 4:
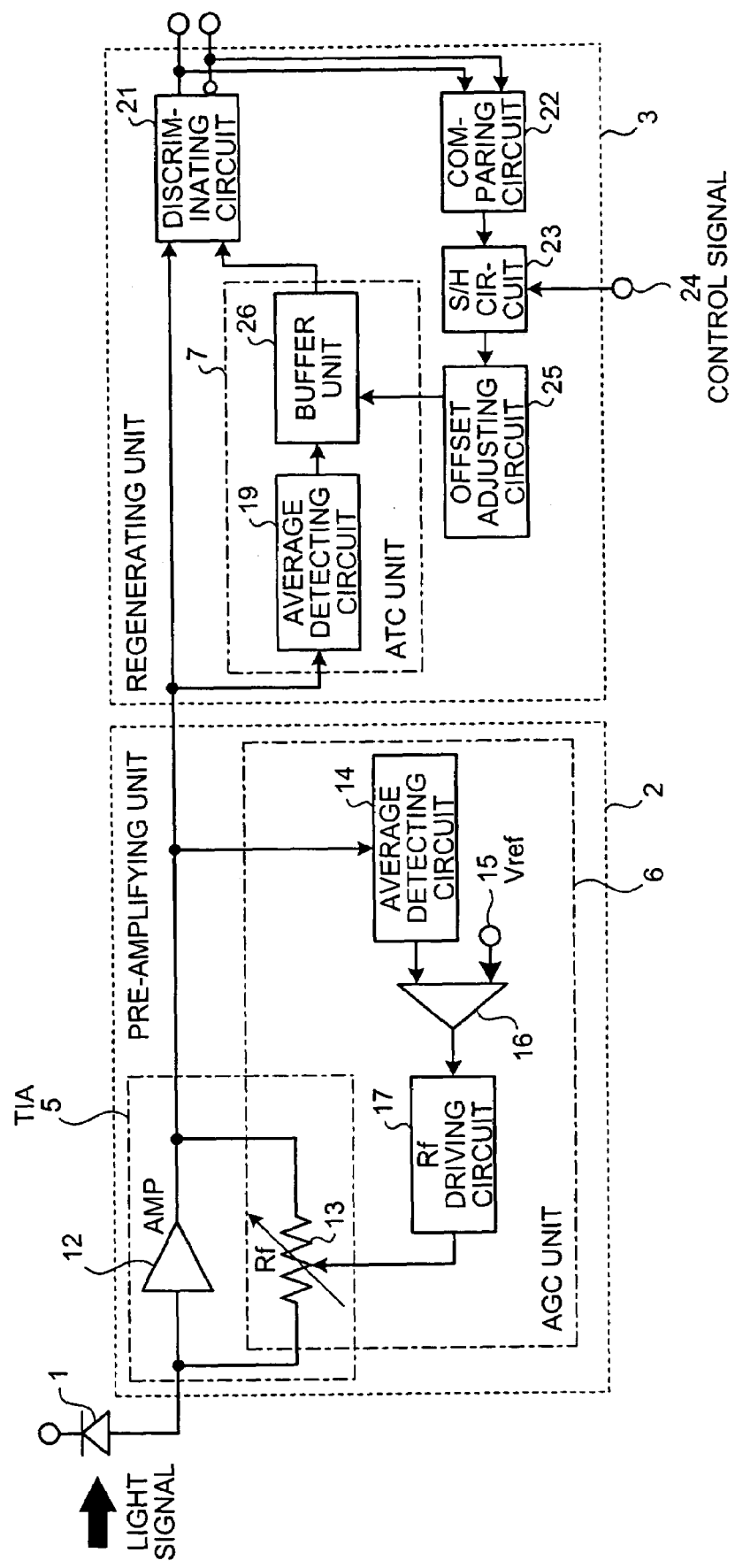
FIG. 4 is a block diagram of a constitution of an optical receiver according to a second embodiment of the present invention.

FIG. 4 is a block diagram of a constitution of an optical receiver according to a second embodiment of the present invention. The regenerating unit 3 of the optical receiver shown in the figure includes a discriminating circuit 21 that outputs a positive phase output and a negative phase output instead of the discriminating circuit 18 according to the first embodiment. The regenerating unit 3 further includes a comparing circuit 22 serving as a second comparing circuit that generates a differential voltage between both the phase outputs of the discriminating circuit 21, a sample-and-hold (S/H) circuit 23 that decides, based on a signal level of a control signal 24, whether an output (the differential voltage) of the comparing circuit 22 should be held or outputted to a circuit at the next stage, and an offset adjusting circuit 25 that outputs an offset adjusting signal generated based on an output of the S/H circuit 23 to the ATC unit 7. The ATC unit 7 further includes a buffer unit 26 that is connected to an output side of the average detecting unit 19 in the constitution of the first embodiment and to which the output (the offset adjusting signal) of the offset adjusting circuit 25 is inputted. An output of the buffer unit 26 is inputted to the discriminating circuit 21. The other components of the optical receiver are identical with or equivalent to those in the first embodiment shown in FIG. 1. The components are denoted by the identical reference numerals. Explanations of the components are omitted. In the following explanation, operations different from those in the first embodiment are mainly explained.

An operation of the regenerating unit 3 shown in FIG. 4 is explained. As a characteristic of the operation of the regenerating unit 3 according to this embodiment, the operation is different from that in the first embodiment in that an initial offset of the regenerating unit 3 is automatically adjusted to be minimized. More specifically, the comparing circuit 22 generates a differential voltage between a positive phase output and a negative phase output of the discriminating circuit 21 and outputs the differential voltage to the S/H circuit 23. The control signal 24 is inputted to the S/H circuit 23. The control signal 24 designates operation modes of the S/H circuit 23 including a sample mode and a hold mode. When a signal level of the control signal 24 designates the hold mode, the S/H circuit 23 holds a sampled voltage. When a signal level of the control signal 24 designates the sample mode, the S/H circuit 23 outputs a sampled voltage to the offset adjusting circuit 25. When the sampled voltage is outputted to the offset adjusting circuit 25, an output voltage of the buffer unit 26 of the ATC unit 7 is changed based on the output of the offset adjusting circuit 25. A feedback loop for reducing a voltage difference between a positive phase output and a negative phase output of a discriminating circuit to nearly zero acts on the discriminating circuit 21. Circuit offset components of the discriminating circuit 21 and the ATC unit 7 are canceled. Sensitivity fluctuation of the optical receiver itself is reduced by this operation.

As explained above, according to the second embodiment, an offset component included in an output of the second average detecting circuit is controlled based on an output of the sample-and-hold circuit that holds or transmits a comparative output obtained by comparing respective differential outputs of the discriminating circuit. Thus, feedback control for reducing a voltage difference between differential outputs of the discriminating circuit to nearly zero is performed. It is possible to reduce sensitivity fluctuation of the optical receiver itself.

THIRD EMBODIMENT

FIG. 5 is a diagram for explaining an operation of an optical receiver according to a third embodiment of the present invention. In FIG. 5, (a) is a burst signal having a light signal waveform in which a transient response occurs; and (b) is respective outputs of the optical receiver. A solid line section indicates, for example, a positive phase output of the discriminating circuit 21. A broken line section indicates, for example, a negative phase output of the discriminating circuit 21. A part indicated by (c) is an example of a control signal waveform of the control signal 24 inputted to the S/H circuit 23.

A characteristic of the third embodiment resides in an output form of the control signal 24 indicated by © shown in FIG. 5. The control signal 24 for setting an operation mode of the S/H circuit 23 in the sample mode only in a non-signal period after application of a power supply is outputted. Therefore, an output offset in the non-signal period after application of a power supply is minimized. Since the output offset in the non-signal period after application of a power supply is minimized, it is possible to maintain minimized state of the output offset even in non-signal periods (in an example in FIG. 5, a first packet interval between a first packet and a second packet and a second packet interval after the second packet) similar to the non-signal period after application of a power supply.

As explained above, according to this embodiment, since offset control by an offset adjusting circuit is performed in the non-signal period after application of a power supply, it is possible to effectively maintain minimized state of the output offset.

FOURTH EMBODIMENT

FIG. 6 is a diagram for explaining an operation of an optical receiver according to a fourth embodiment of the present invention. In the third embodiment, an operation mode of the S/H circuit 23 is designated to be the sample mode only in the non-signal period after application of a power supply. However, in this embodiment, an operation mode of the S/H circuit 23 is designated to be the sample mode in all no-signal areas of a light signal. In an example in the figure, the non-signal period after application of a power supply is set to be in the hold mode. It goes without saying that an operation mode in this period may be set to be the sample mode.

When the optical receiver is continuously operating, it is likely that output offset components are accumulated to gradually increase. On the other hand, in this embodiment, the operation mode of the S/H circuit 23 is set in the sample mode in all the no-signal areas of a light signal. Thus, accumulation of output offset components is prevented. This makes it possible to reduce deterioration over time or aged deterioration in offset components.

As explained above, according to this embodiment, the offset control by the offset adjusting circuit is performed in non-signal periods among light signals. Thus, it is possible to prevent accumulation of output offset components and reduce deterioration over time or aged deterioration in offset components.

INDUSTRIAL APPLICABILITY

As described above, the optical receiver according to the prevent invention is useful for, for example, a PON system that transmits a burst-like light signal and suitable, in particular, when a transient response of an input signal becomes a problem.

The invention claimed is:

1. An optical receiver comprising:
   a pre-amplifying unit that performs voltage conversion and amplification of an output of a light-receiving element that receives a light signal and converts the received light signal into a current signal; and
   a regenerating unit including a discriminating circuit that receives an output signal of the pre-amplifying unit as an input signal and performs a signal discrimination of the input signal based on a threshold generated based on the input signal, wherein
   the pre-amplifying unit includes a first average detecting circuit that detects an average of output signals of the pre-amplifying unit, and controls an amplification gain based on a result of comparison between an output of the first average detecting circuit and a predetermined reference voltage,
   the regenerating unit further includes a second average detecting circuit that detects an average of input signals to the discriminating circuit, and
   the discriminating circuit receives an output of the second average detecting circuit as the threshold for signal discrimination of the input signal.

2. The optical receiver according to claim 1, wherein the regenerating unit further includes
   a comparing circuit that receives an in-phase output and a reverse-phase output of the discriminating circuit as a differential input;
   a buffer unit that holds the output of the second average detecting circuit;
   a sample-and-hold circuit that holds or transmits an output of the comparing circuit; and
   an offset adjusting circuit that adjusts offset components of the buffer unit based on an output of the sample-and-hold circuit.

3. The optical receiver according to claim 2, wherein the offset adjusting circuit adjusts the offset components of the buffer unit in a non-signal period after switching power on.

4. The optical receiver according to claim 2, wherein the offset adjusting circuit adjusts the offset components of the buffer unit in a non-signal period between the light signals.

5. A discrimination-threshold generating method for an optical receiver, the optical receiver including a pre-amplifying unit that performs voltage conversion and amplification of an output of a light-receiving element that receives a light signal and converts the received light signal into a current signal, and a regenerating unit including a discriminating circuit that receives an output signal of the pre-amplifying unit as an input signal and performs a signal discrimination of the input signal based on a threshold generated based on the input signal, the discrimination-threshold generating method comprising:

controlling an amplification gain of the pre-amplifying unit based on a result of comparison between a first average detection output obtained by detecting an average of output signals of the pre-amplifying unit and a predetermined reference voltage; and outputting a second average detection output obtained by detecting an average of input signals to the discriminating circuit to the discriminating circuit as the threshold for performing signal discrimination of the input signal.

* * * * *